(12) United States Patent
Payne et al.

(10) Patent No.: US 10,386,413 B2
(45) Date of Patent: Aug. 20, 2019

(54) CIRCUIT AND METHOD FOR TESTING FLIP FLOP STATE RETENTION

(71) Applicant: FREESCALE SEMICONDUCTOR, INC., Austin, TX (US)

(72) Inventors: Andrew H. Payne, Austin, TX (US); Jose A. Lyon, Austin, TX (US); Colin MacDonald, Austin, TX (US)

(73) Assignee: NXP USA, Inc., Austin, TX (US)

( * ) Notice: Subject to any disclaimer, the term of this patent is extended or adjusted under 35 U.S.C. 154(b) by 478 days.

(21) Appl. No.: 15/264,958

(22) Filed: Sep. 14, 2016

(65) Prior Publication Data

US 2018/0074122 A1    Mar. 15, 2018

(51) Int. Cl.
*G01R 31/3177* (2006.01)
*G01R 31/317* (2006.01)
*H03K 3/037* (2006.01)
*G01R 31/3193* (2006.01)

(52) U.S. Cl.
CPC ..... *G01R 31/3177* (2013.01); *G01R 31/31703* (2013.01); *G01R 31/31723* (2013.01); *G01R 31/31937* (2013.01); *H03K 3/0375* (2013.01)

(58) Field of Classification Search
CPC .......... G01R 31/3177; G01R 31/31703; G01R 31/31937; G01R 31/31723; H03K 3/0375
See application file for complete search history.

(56) References Cited

U.S. PATENT DOCUMENTS

| 6,021,514 A * | 2/2000 | Koprowski .... G01R 31/318558 714/733 |
| 8,407,542 B2 | 3/2013 | Douskey et al. |
| 8,461,865 B2 | 6/2013 | Schlagenhaft |
| 2003/0110432 A1* | 6/2003 | Hill ................. G01R 31/31721 714/726 |
| 2003/0200492 A1* | 10/2003 | Nakao ............ G01R 31/318547 714/724 |
| 2006/0168489 A1* | 7/2006 | Mitra ............. G01R 31/318541 714/724 |
| 2006/0190781 A1* | 8/2006 | Farmer ............ G01R 31/31727 714/724 |
| 2007/0016834 A1* | 1/2007 | Debnath ........ G01R 31/318575 714/726 |

(Continued)

OTHER PUBLICATIONS

Das et al., "Reducing Test Data Volume Using External/Lbist Hybrid Test Patterns", IEEE 2000, pp. 115-122.

*Primary Examiner* — Guy J Lamarre
(74) *Attorney, Agent, or Firm* — Mary Jo Bertani

(57) ABSTRACT

An integrated circuit includes a plurality of state retention power gating (SRPG) flip-flops coupled in a first chain, wherein the first chain has a first scan input and a first scan output; a pseudo random pattern generator (PRPG) configured to generate test patterns in response to seeds; a multiplexer (MUX) coupled between the PRPG and the first scan input and coupled to receive a select signal; and response compression logic coupled to the first scan output and configured to generate a test signature in response to an output pattern provided at the first scan output. The MUX is configured to, when the select signal has a first value, couple a first output of the PRPG to the first scan input, and, when the select signal has a second value, couple an inversion of the first output of the PRPG to the first scan input.

20 Claims, 3 Drawing Sheets

(56) References Cited

U.S. PATENT DOCUMENTS

| | | | |
|---|---|---|---|
| 2009/0094496 A1* | 4/2009 | Le | G06F 11/27 714/733 |
| 2011/0080208 A1* | 4/2011 | Sanavage | G11C 11/46 327/518 |
| 2011/0221469 A1* | 9/2011 | Schlagenhaft | G01R 31/318541 326/16 |
| 2012/0110402 A1* | 5/2012 | Wang | G01R 31/318558 714/729 |
| 2012/0124433 A1* | 5/2012 | Policke | G01R 31/318558 714/724 |
| 2014/0132291 A1 | 5/2014 | Somachudan et al. | |

* cited by examiner

CIRCUIT AND METHOD FOR TESTING FLIP FLOP STATE RETENTION

BACKGROUND OF THE INVENTION

The present invention relates generally to integrated circuits, and more particularly, to testing flip-flop circuitry for state retention.

Integrated circuits (ICs) including system-on-chips (SoCs) integrate various digital and sometimes analog components on a single chip. ICs may have manufacturing defects such as physical failures and fabrication defects that cause the ICs to malfunction. Thus, the ICs need to be tested to detect manufacturing defects. Design for test (DFT) techniques add testability features to ICs that allow automatic test equipment (ATEs) to execute various fault tests using test patterns generated by an automatic test pattern generator (ATPG) on the ICs to identify manufacturing defects. ICs undergoing testing are referred to as circuits-under-test (CUT).

ICs that undergo fault testing include multiple scan flip-flops that form a scan-chain. Test data is shifted in one end of the scan chain and out the other with the starting data compared to the shift out data to detect any faults. A particular type of flip-flops known as a state retention power gating (SRPG) flip-flops are used to store the state of an integrated circuit during power-down. It is desirable to have the capability to test the functionality of the SRPG flip-flops during the manufacturing process and while in use in the field.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like reference numbers indicate similar elements.

DETAILED DESCRIPTION OF THE PRESENT INVENTION

The detailed description of the appended drawings is intended as a description of the currently preferred embodiments of the present invention, and is not intended to represent the only forms in which the present invention may be practiced. It is to be understood that the same or equivalent functions may be accomplished by different embodiments that are intended to be encompassed within the scope of the claims.

Embodiments of integrated circuits and methods are disclosed which allow state retention testing of state retention power gating (SRPG) flip-flop circuits using existing logic built-in test (LBIST) circuitry, which lowers the cost of test and provides customers the ability to test parts in the field. LBIST circuitry was previously not intended for performing state retention testing. Traditional scan testing enables greater control of the stimulus by loading SRPG flip-flop circuitry with specific values. However, since LBIST uses Linear Feedback Shift Register (LFSR) logic to generate pseudo-random sequences, state retention of the SRPG flip-flop circuitry could previously not be checked in a deterministic way. This presented a problem when creating low power systems on a chip (SoCs) with SRPG flip-flop circuitry that rely on LBIST for scan testing. In the present disclosure, currently-existing LBIST circuitry is utilized to test SRPG flip-flop circuitry in the field or with low-cost test equipment with very little modification to the SoC design or to the design flow. In selected embodiments, an inverter and a multiplexer are added to the start of each scan chain. A test controller sets the multiplexer to allow an original test vector to be used during a first phase of the test. The setting on the multiplexer is then changed to allow the inverse of the original test vector from the inverter to be used during a second phase of the test. In this manner, all of the flip-flop circuits are tested for both "1s" and "0s" using existing LBIST circuitry with minimal changes.

Figure 1:
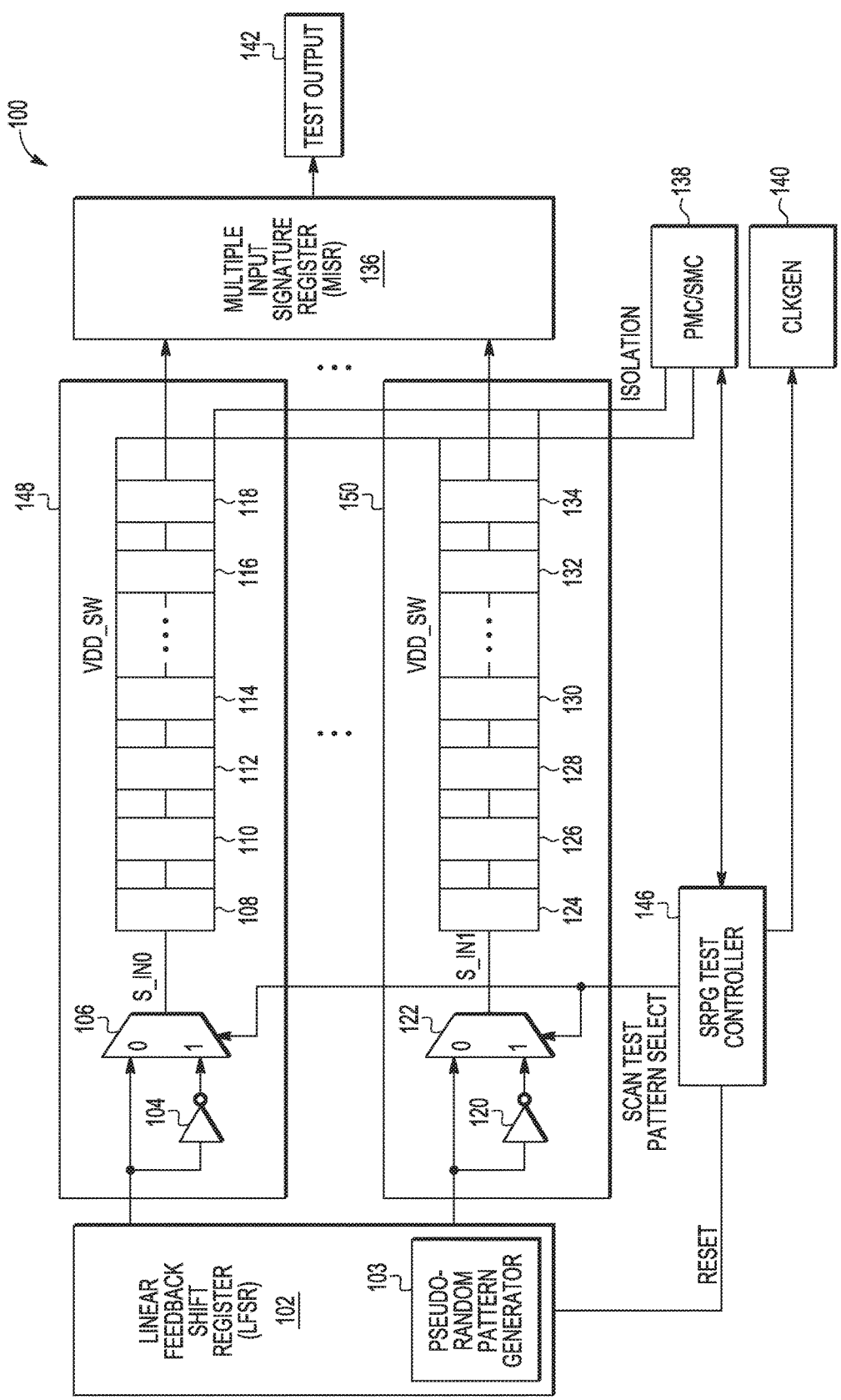
FIG. 1 is a block diagram of an integrated circuit in accordance with selected embodiments of the present invention.

FIG. 1 is a block diagram of an integrated circuit (IC) 100 for LBIST in accordance with selected embodiments of the present invention. IC 100 includes linear feedback shift register (LFSR) 102, pseudo-random pattern generator 103, inverters 104, 120, multiplexers 106, 122, SRPG flip-flop circuitry 108-118, 124-134, multiple input signature register (MISR) 136, power management controller/system management controller 138, clock generator 140, and test output buffer 142. Inverter 104, multiplexer 106 and flip-flop circuits 108-118 are collectively referred to herein as a "first scan test chain 148". Inverter 120, multiplexer 122 and flip-flop circuits 124-134 are collectively referred to herein as a "second scan test chain 150". Although scan test chains 148, 150 each show six flip-flop circuits 108-118, 124-134, scan test chains 148, 150 can include any suitable number of flip-flop circuits. Additionally, although only two scan test chains 148, 150 are shown, integrated circuit 100 can include any suitable number of scan test chains 148, 150.

Pseudo-random pattern generator is configured to generate and provide scan test patterns to scan test chains 148, 150. The scan test pattern for each of scan test chains 148, 150 is independent of and can be different from the scan test patterns for the other scan test chains 148, 150. LFSR 102 receives a reset signal from SRPG test controller 146, which indicates that LFSR 102 should generate each test pattern using the same seed as the immediately preceding seed for the test pattern. When the same seed is used, the resulting test pattern will be the same as the immediately preceding test pattern for the corresponding scan test chains 148, 150. Inverters 104, 120 are used to generate the inverse or opposite test pattern that is supplied to scan test chains 148, 150 after the immediately preceding uninverted test pattern is provided to scan test chains 148, 150.

A first input terminal of multiplexer 106 is coupled to a first output of LFSR 102, on which a first scan test pattern may be provided. Inverter 104 has an input terminal coupled to the first output of LFSR 102, and an output terminal coupled to a second input terminal of multiplexer 106. An output of multiplexer 106 is provided as scan test pattern data to flip-flop circuits 108-118. The output of the last flip-flop circuit 118 in scan test chain 148 is provided at a first input to MISR 136.

A first input terminal of multiplexer 122 is coupled to a second output of LFSR 102, on which a second scan test pattern may be provided. Inverter 120 has an input terminal coupled to corresponding output of LFSR 102, and an output terminal coupled to a second input terminal of multiplexer 122. An output of multiplexer 122 is provided as scan test pattern data to flip-flop circuits 124-134. The output of the last flip-flop circuit 134 in scan test chain 150 is provided at a second input to MISR 136.

Power management controller/system management controller (PMC/SMC) 138 is configured to provide a switched supply voltage VDD_SW and an isolation signal to flip-flop circuits 108-118, 124-134. The isolation signal causes flip-flop circuits 108-118, 124-134 to ignore input data and retain the existing data in flip-flop circuits 108-118, 124-134.

SRPG test controller 146 also generates a scan test pattern select signal that is provided to a control input of multiplexers 106, 122. The scan test pattern select signal determines whether a non-inverted or an inverted version of the scan test pattern from LFSR 102 will be provided to flip-flop circuits 108-118, 124-134.

PMC/SMC 138 is configured to communicate with SRPG test controller 146 to coordinate signals sent to the scan test chains 148, 150 during testing. Clock generator 140 is controlled by SRPG test controller 146 to provide a clock signal to flip-flop circuits 108-118 and 124-134.

Figure 2:
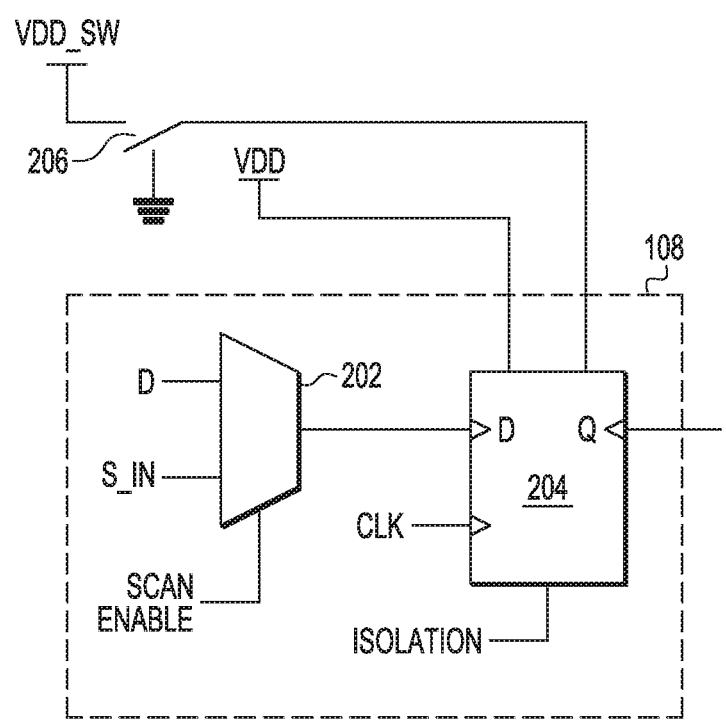
FIG. 2 is a schematic block diagram of an embodiment of a state retention power gating (SRPG) flip-flop circuit that can be used in the integrated circuit of FIG. 1.

Referring to FIGS. 1 and 2, FIG. 2 is a schematic block diagram of an embodiment of a state retention power gating (SRPG) flip-flop circuit 108 that can be used in the integrated circuit 100 of FIG. 1. Flip-flop circuit 108 includes multiplexer 202 having a functional data input D, a scan input S_IN, and a scan enable control signal SE that is used to select between the functional data input and the scan input. The functional data can be used during normal operation, and the scan input can be used during scan testing. The values used at the scan input are referred to as test vectors, where the input values can be predetermined or randomly generated.

The output of multiplexer 202 is provided as input to a data port (D) of D-flop circuit 204. A clock signal is provided to a clock input of D-flop circuit 204. An output (Q) of D-flop circuit 204 is provided as input to the data and scan inputs of a multiplexer (not shown) in flip-flop circuit 110 (FIG. 1). Flip-flop circuits 108-118, 124-134 are connected in form of a chain, which effectively acts as a shift register. Operation of scan chains 148, 150 involves shifting in and loading all the flip-flop circuits 108-118, 124-134 with corresponding input vectors. During scan-in, the data flows from the output of one flip-flop circuit to the scan-input of the next flip-flop circuit. The data is then shifted out to MISR 136 to form an output signature, and the signature is compared with an expected signature. In case of any mismatch, the output signature can point to nodes where manufacturing defects may be found.

The isolation signal is provided to D-flop circuit 204 by PMC/SMC 138. When asserted, the isolation signal causes D-flop circuit 204 to ignore data and scan inputs and save the data in flip-flop circuits 108-118, 124-134 in internal logic, such as a slave flip-flop circuit. The switched supply voltage VDD_SW and unswitched supply voltage VDD are also provided to D-flop circuit 204 by PMC/SMC 138. Switch 206 is configured to couple switched supply voltage VDD_SW to D-flop circuit 204 in one position, and to disconnect switched supply voltage VDD_SW from D-flop circuit 204 by connecting a terminal of switch 206 to ground in another position.

Figure 3:
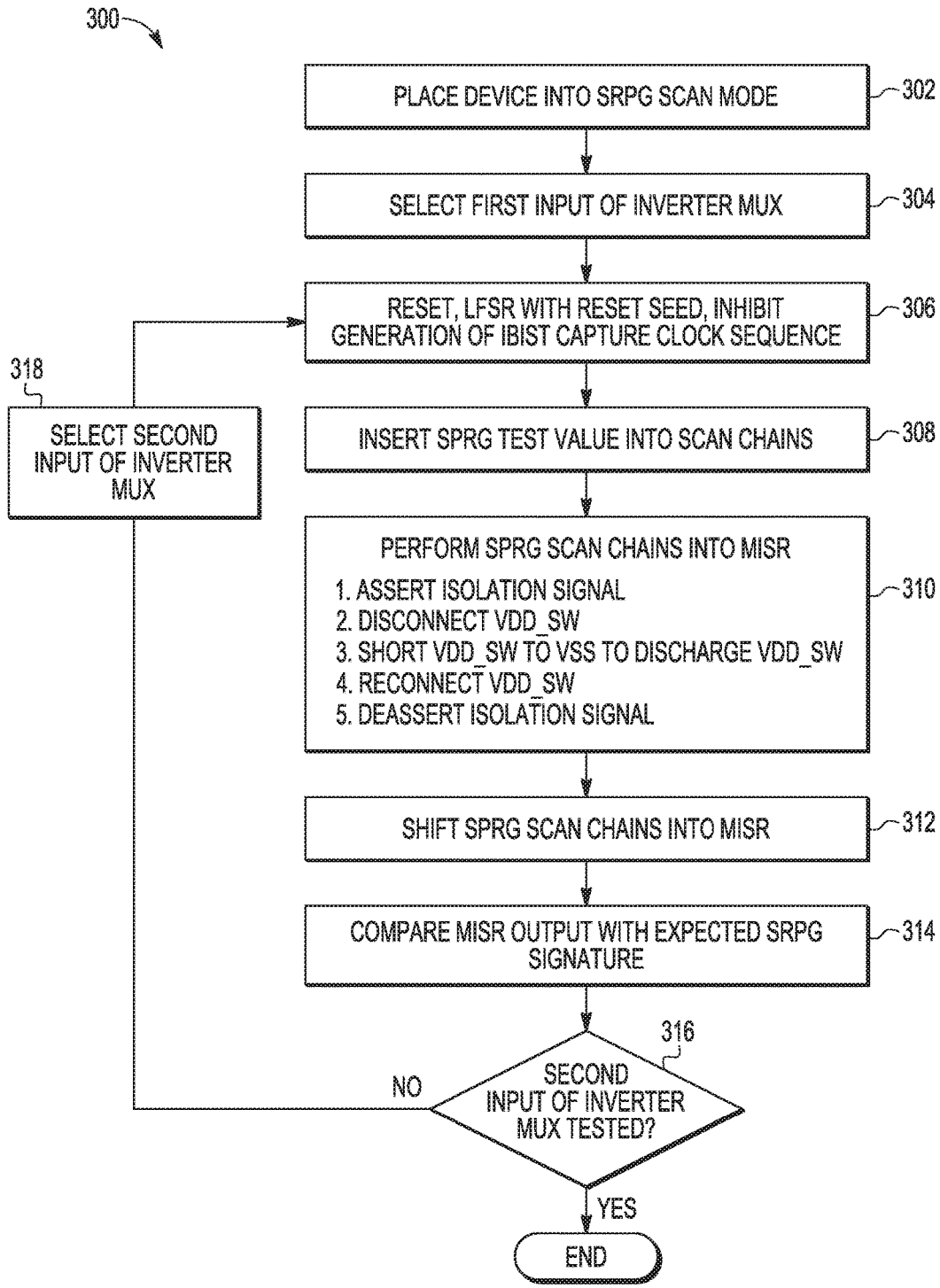
FIG. 3 is a flow diagram of a method for testing the SRPG flip-flop circuits of FIG. 1.

Referring to FIGS. 1 and 3, FIG. 3 is a flow diagram of a method 300 for testing the SRPG flip-flop circuits 108-118, 124-134 of FIG. 1. In process 302, the IC 100 is placed in SRPG scan mode by setting the scan enable signal to select the scan input on multiplexer 202 (FIG. 2) for all flip-flop circuits 108-118, 124-134. Process 304 includes selecting a first input of multiplexers 106, 122, which in FIG. 1, is performed by SRPG test controller 146 setting the scan test pattern select signal to "0" (or ("1")).

Process 306 includes resetting LFSR 102 using a reset seed to generate a scan vector in pseudo-random pattern generator 103. The reset seed will be the same for two iterations of the scan test. In the first test, a non-inverted version of the scan vector will be used, and in the second test, an inverted version of the scan vector is used, or vice versa. In addition, a capture sequence that is typically performed in scan tests is inhibited in scan chains 148, 150 by a built-in self-test SRPG scan mode signal.

Process 308 includes inserting the SRPG scan vector(s) into scan chains 148, 150 by shifting the scan vectors through flip-flop circuits 108-118, 124-134. Process 310 includes performing an SRPG test sequence that includes asserting the isolation signal, which causes flip-flop circuits 108-118, 124-134 to ignore data input and save data currently in flip-flop circuits 108-118, 124-134 in internal logic, such as a slave flip-flop circuit or other suitable storage circuit. Once the isolation signal is asserted and the data in flip-flop circuits 108-118, 124-134 is stored, a terminal of switch 206 is connected to ground to disconnect power from flip-flop circuits 108-118, 124-134. Note that supply voltage VDD is still supplied to allow internal or slave flip-flop circuits to retain the data while the data is cleared from the master flip-flop circuits 108-118, 124-134. Once data is discharged from master flip-flop circuits 108-118, 124-134, switch 206 is moved to re-connect switched supply voltage VDD_SW to flip-flop circuits 108-118, 124-134. The isolation signal is then de-asserted, which allows data to be restored from internal or slave flip-flop circuits to master flip-flop circuits 108-118, 124-134.

In process 312, the SRPG scan chains are shifted into MISR 136 by clocking flip-flop circuits 108-118, 124-134 a number of times until all the data in the scan vectors are shifted through flip-flop circuits 108-118, 124-134. MISR 136 compresses the data from flip-flop circuits 108-118, 124-134 into a signature, and process 314 includes comparing the signature generated by MISR 136 to an expected SRPG signature. If the actual and expected signatures do not match, a signal indicating a malfunction with the SRPG function can be sent to a monitoring processor to take corrective action. The comparison may be made using an on-chip comparator, or the signature generated by MISR 136 may be sent to a component external to system 100 for comparison with an expected signature.

Process 316 checks whether the second input to multiplexers 106, 122 has been tested. If not, process 316 transitions to process 318 to select the second input of multiplexers 106, 122, which causes the inverted scan vector to be input to scan chains 148, 150. Process 318 then transitions to process 306 to run the SRPC test for the inverted scan vector. Once process 316 is reached again, method 300 terminates since the SRPG function has now been thoroughly tested with both "1s" and "0s" through each flip-flop circuit 108-118, 124-134.

By now it should be appreciated that in selected embodiments, an integrated circuit can comprise a plurality of state retention power gating (SRPG) flip-flops coupled in a first chain, wherein the first chain has a first scan input and a first scan output. A pseudo random pattern generator (PRPG) is configured to generate test patterns in response to seeds. A multiplexer (MUX) is coupled between the PRPG and the first scan input and coupled to receive a select signal. The MUX is configured to when the select signal has a first value, couple a first output of the PRPG to the first scan input, and when the select signal has a second value, couple an inversion of the first output of the PRPG to the first scan input. Response compression logic is coupled to the first scan output and configured to generate a test signature in response to an output pattern provided at the first scan output.

In another aspect, each of the plurality of SRPG flip-flops can be configured to receive a switched power supply and a non-switched power supply. The integrated circuit further comprising: a test controller configured to: reset the PRPG with a reset seed, and set the select signal to the first value while a first test pattern generated in response to the reset seed is provided at the first output of the PRPG such that the first test pattern is scanned into the plurality of SRPG flip-flops. After the first test pattern is scanned into the plurality of SRPG flip-flops, the switched power supply is decoupled from each SRPG flip-flop at a first time. After the switched power supply is decoupled from each SRPG flip-flop at the first time, the switched power supply back is coupled to each SRPG flip-flop at a second time.

In another aspect, the first chain can be configured to, after the switched power supply is coupled back to each SRPG flip-flop, provide a first output pattern at the first scan output to the response compression logic in response to the first test pattern.

In another aspect, the test controller can be configured to, after the first output pattern is provided to the response compression logic, reset the PRPG with the reset set: reset the PRPG with the reset seed, and set the select signal to the second value while the first test pattern generated in response to the reset seed is provided at the first output of the PRPG such that an inverse of the first test pattern is scanned into the plurality of SRPG flip-flops. After the inverse of the first pattern is scanned into the plurality of SRPG flip-flops, the switched power supply is decoupled back to each SRPG flip-flop at a third time. After the switched power supply is decoupled from each SRPG flip-flop at the third time, the switched power supply is coupled back to each SRPG flip-flop at a fourth time.

In another aspect, the first chain can be configured to, after the switched power supply is coupled back to each SRPG flip-flop at the fourth time, provide a second output pattern at the first scan output to the response compression logic in response to the inverse of the first test pattern.

In another aspect, the test controller can be further configured to, prior to decoupling the switched power supply from each SRPG flip-flop at the first time, assert an isolation signal at an isolation input of each SRPG flip-flop to enable each SRPG flip-flop to retain state, and after coupling the switched power supply back to each SRPG flip-flop at the second time, deassert the isolation signal at the isolation input of each SRPG flip-flop.

In another aspect, a first test signature generated by the response compression logic in response to the first output pattern can be compared to a first expected signature.

In another aspect, a first test signature generated by the response compression logic in response to the first output pattern can be compared to a first expected signature, and a second test signature generated by the response compression logic in response to the second output pattern can be compared to a second expected signature.

In another aspect, the integrated circuit can further comprise a clock generator configured to provide a shift clock to each of the plurality of SRPG flip-flops, wherein the PRPG provides a next bit of the first test pattern at the first output of the PRPG with each cycle of the shift clock.

In another aspect, the response compression logic can be configured to receive a next bit of the first output pattern from the first scan output with each cycle of the shift clock.

In another aspect, the integrated circuit can further comprise a second plurality of state retention power gating (SRPG) flip-flops coupled in a second chain, wherein the second chain has a second scan input and a second scan output; and a second MUX coupled between the PRPG and the second scan input and coupled to receive the select signal, wherein the second MUX is configured to: when the select signal has the first value, couple a second output of the PRPG to the second scan input, and when the select signal has the second value, couple an inversion of the second output of the PRPG to the second scan input. The response compression logic can be coupled to the second scan output and configured to generate a test signature in response to output patterns provided at the first scan output and at the second scan output.

In other selected embodiments, in an integrated circuit having a plurality of state retention power gating (SRPG) flip-flops coupled in a first scan chain, wherein each of the plurality of SRPG flip-flops is configured to receive a switched power supply at first terminal, a method can comprise resetting a pseudo random pattern generator (PRPG) with a reset seed; providing a first test pattern generated from the reset seed to the first scan chain; decoupling the switched power supply from the SRPG flip-flops at a first time; after the decoupling the switched power supply from the SRPG flip-flops at the first time, coupling the switched power supply back to the SRPG flip-flops at a second time; shifting a first output pattern based on the first test pattern from the first scan chain into response compression logic; after shifting the first output pattern from the first scan chain, resetting the PRPG with the reset seed; providing an inverse of the first test pattern generated from the reset seed to the first scan chain; decoupling the switched power supply from the SRPG flip-flops at a third time; after the decoupling the switched power supply from the SRPG flip-flops at the third time, coupling the switched power supply back to the SRPG flip-flops at a fourth time; and shifting a second output pattern based on the inverse of the first test pattern from the first scan chain into the response compression logic.

In another aspect, the method can further comprise, after shifting the first output pattern from the first scan chain into the response compression logic, generating, by the response compression logic, a first test signature using on the first output pattern; and comparing the first test signature to a first expected signature.

In another aspect, the method can further comprise, after shifting the second output patterns from the first scan chain into the response compression logic, generating, by the response compression logic, a second test signature using the second output pattern; and comparing the second test signature to a second expected signature.

In another aspect, the method can further comprise, after providing the first test pattern to the first scan chain and prior to decoupling the switched power supply from the SRPG flip-flops at the first time, asserting an isolation signal at an isolation input of each SRPG flip-flop to enable each SRPG flip-flop to retain state; and after coupling the switched power supply back to the SRPG flip-flops at the second time, deasserting the isolation signal at the isolation input of each SRPG flip-flop.

In another aspect, the method can further comprise, after decoupling the switched power supply from the SRPG flip-flops at the first time and prior to coupling the switched power supply back to the SRPG flip-flops at the second time, coupling the first terminals of the SRPG flip-flops to ground.

In another aspect, each of the plurality of SRPG flip-flops can be configured to receive a non-switched power supply at second terminal, wherein when the switched power supply is decoupled from the SRPG flips flops, the non-switched power supply is maintained at the second terminals of the SRPG flip-flops.

In further selected embodiments, an integrated circuit can comprise a plurality of state retention power gating (SRPG) flip-flops coupled in a first chain, wherein the first chain has a first scan input and a first scan output, and wherein each of the plurality of SRPG flip-flops is configured to receive a switched power supply; a pseudo random pattern generator (PRPG); a multiplexer (MUX) coupled between the PRPG and the first scan input and coupled to receive a select signal; response compression logic coupled to the first scan output and configured to generate a test signature in response to an output pattern provided at the first scan output; and a test controller configured to: set the select signal to a first value; reset the PRPG with a reset seed, scan a first test pattern generated by the PRPG in response to the reset seed into the plurality of SRPG flip-flops via a first path of the MUX, after the first test pattern is scanned into the plurality of SRPG flip-flops, decouple the switched power supply from each SRPG flip-flop at a first time, after the switched power supply is decoupled from each SRPG flip-flop at the first time, couple the switched power supply back to each SRPG flip-flop at a second time, and after the switched power supply is coupled back to each SRPG flip-flop at the second time, provide a first output pattern at the first scan output to the RESPONSE COMPRESSION LOGIC in response to the first test pattern.

In another aspect, the test controller can be further configured to: set the select signal to a second value, different from the first value; reset the PRPG with the reset seed, scan an inverse of the first test pattern generated by the PRPG in response to the reset seed into the plurality of SRPG flip-flops via a second path of the MUX, after the inverse of the first test pattern is scanned into the plurality of SRPG flip-flops, decouple the switched power supply from each SRPG flip-flop at a third time, and after the switched power supply is decoupled from each SRPG flip-flop at the third time, couple the switched power supply back to each SRPG flip-flop at a fourth time, and after the switched power supply is coupled back to each SRPG flip-flop at the fourth time, provide a second output pattern at the first scan output to the RESPONSE COMPRESSION LOGIC in response to the inverse of the first test pattern.

In another aspect, the test controller can be further configured to: the first test pattern is scanned into to the first plurality of SRPG flip-flops and prior to the switched power supply being decoupled from the SRPG flip-flops at the first time, assert an isolation signal at an isolation input of each SRPG flip-flop to enable each SRPG flip-flop to retain state; and the switched power supply is coupled back to the SRPG flip-flops at the second time, deassert the isolation signal at the isolation input of each SRPG flip-flop.

Because the apparatus implementing the present disclosure is, for the most part, composed of electronic components and circuits known to those skilled in the art, circuitry details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
a plurality of state retention power gating (SRPG) flip-flops coupled in a first chain, wherein the first chain has a first scan input and a first scan output;
a pseudo random pattern generator (PRPG) configured to generate test patterns in response to seeds;
a multiplexer (MUX) coupled between the PRPG and the first scan input and coupled to receive a select signal, wherein the MUX is configured to:
when the select signal has a first value, couple a first output of the PRPG to the first scan input, wherein the first output of the PRPG is coupled to a first input of the MUX, and
when the select signal has a second value, couple an inversion of the first output of the PRPG to the first scan input, wherein the inversion of the first output of the PRPG is coupled to a second input of the MUX; and
response compression logic coupled to the first scan output and configured to generate a test signature in response to an output pattern provided at the first scan output.

2. The integrated circuit of claim 1, wherein each of the plurality of SRPG flip-flops is configured to receive a switched power supply and a non-switched power supply, the integrated circuit further comprising:
a test controller configured to:
reset the PRPG with a reset seed,
set the select signal to the first value while a first test pattern generated in response to the reset seed is provided at the first output of the PRPG such that the first test pattern is scanned into the plurality of SRPG flip-flops,
after the first test pattern is scanned into the plurality of SRPG flip-flops, decouple the switched power supply from each SRPG flip-flop at a first time, and
after the switched power supply is decoupled from each SRPG flip-flop at the first time, couple the switched power supply back to each SRPG flip-flop at a second time.

3. The integrated circuit of claim 2, wherein the first chain is configured to, after the switched power supply is coupled back to each SRPG flip-flop, provide a first output pattern at the first scan output to the response compression logic in response to the first test pattern.

4. The integrated circuit of claim 3, wherein the test controller is configured to, after the first output pattern is provided to the response compression logic, reset the PRPG with the reset set:
reset the PRPG with the reset seed,
set the select signal to the second value while the first test pattern generated in response to the reset seed is provided at the first output of the PRPG such that an inverse of the first test pattern is scanned into the plurality of SRPG flip-flops,
after the inverse of the first pattern is scanned into the plurality of SRPG flip-flops, decouple the switched power supply back to each SRPG flip-flop at a third time, and
after the switched power supply is decoupled from each SRPG flip-flop at the third time, couple the switched power supply back to each SRPG flip-flop at a fourth time.

5. The integrated circuit of claim 4, wherein the first chain is configured to, after the switched power supply is coupled back to each SRPG flip-flop at the fourth time, provide a second output pattern at the first scan output to the response compression logic in response to the inverse of the first test pattern.

6. The integrated circuit of claim 5, wherein a first test signature generated by the response compression logic in response to the first output pattern is compared to a first expected signature, and a second test signature generated by the response compression logic in response to the second output pattern is compared to a second expected signature.

7. The integrated circuit of claim 2, wherein the test controller is further configured to, prior to decoupling the switched power supply from each SRPG flip-flop at the first time, assert an isolation signal at an isolation input of each SRPG flip-flop to enable each SRPG flip-flop to retain state, and after coupling the switched power supply back to each SRPG flip-flop at the second time, deassert the isolation signal at the isolation input of each SRPG flip-flop.

8. The integrated circuit of claim 3, wherein a first test signature generated by the response compression logic in response to the first output pattern is compared to a first expected signature.

9. The integrated circuit of claim 3, further comprising a clock generator configured to provide a shift clock to each of the plurality of SRPG flip-flops, wherein the PRPG provides a next bit of the first test pattern at the first output of the PRPG with each cycle of the shift clock.

10. The integrated circuit of claim 9, wherein the response compression logic is configured to receive a next bit of the first output pattern from the first scan output with each cycle of the shift clock.

11. The integrated circuit of claim 1, further comprising:
a second plurality of state retention power gating (SRPG) flip-flops coupled in a second chain, wherein the second chain has a second scan input and a second scan output; and
a second MUX coupled between the PRPG and the second scan input and coupled to receive the select signal, wherein the second MUX is configured to:
when the select signal has the first value, couple a second output of the PRPG to the second scan input, and
when the select signal has the second value, couple an inversion of the second output of the PRPG to the second scan input;
wherein the response compression logic is coupled to the second scan output and configured to generate a test signature in response to output patterns provided at the first scan output and at the second scan output.

12. In an integrated circuit having a plurality of state retention power gating (SRPG) flip-flops coupled in a first scan chain, wherein each of the plurality of SRPG flip-flops is configured to receive a switched power supply at first terminal, a method comprising:
resetting a pseudo random pattern generator (PRPG) with a reset seed;
providing a first test pattern generated from the reset seed to the first scan chain;
decoupling the switched power supply from the SRPG flip-flops at a first time;
after the decoupling the switched power supply from the SRPG flip-flops at the first time, coupling the switched power supply back to the SRPG flip-flops at a second time;
shifting a first output pattern based on the first test pattern from the first scan chain into response compression logic;
after shifting the first output pattern from the first scan chain, resetting the PRPG with the reset seed;
providing an inverse of the first test pattern generated from the reset seed to the first scan chain;
decoupling the switched power supply from the SRPG flip-flops at a third time;
after the decoupling the switched power supply from the SRPG flip-flops at the third time, coupling the switched power supply back to the SRPG flip-flops at a fourth time; and
shifting a second output pattern based on the inverse of the first test pattern from the first scan chain into the response compression logic.

13. The method of claim 12, further comprising:
after shifting the first output pattern from the first scan chain into the response compression logic, generating, by the response compression logic, a first test signature using on the first output pattern; and
comparing the first test signature to a first expected signature.

14. The method of claim 13, further comprising:
after shifting the second output patterns from the first scan chain into the response compression logic, generating, by the response compression logic, a second test signature using the second output pattern; and comparing the second test signature to a second expected signature.

15. The method of claim 12, further comprising:

after providing the first test pattern to the first scan chain and prior to decoupling the switched power supply from the SRPG flip-flops at the first time, asserting an isolation signal at an isolation input of each SRPG flip-flop to enable each SRPG flip-flop to retain state; and after coupling the switched power supply back to the SRPG flip-flops at the second time, deasserting the isolation signal at the isolation input of each SRPG flip-flop.

16. The method of claim 15, further comprising:

after decoupling the switched power supply from the SRPG flip-flops at the first time and prior to coupling the switched power supply back to the SRPG flip-flops at the second time, coupling the first terminals of the SRPG flip-flops to ground.

17. The method of claim 12, wherein each of the plurality of SRPG flip-flops is configured to receive a non-switched power supply at second terminal, wherein when the switched power supply is decoupled from the SRPG flips flops, the non-switched power supply is maintained at the second terminals of the SRPG flip-flops.

18. An integrated circuit, comprising:

a plurality of state retention power gating (SRPG) flip-flops coupled in a first chain, wherein the first chain has a first scan input and a first scan output, and wherein each of the plurality of SRPG flip-flops is configured to receive a switched power supply;

a pseudo random pattern generator (PRPG);

a multiplexer (MUX) coupled between the PRPG and the first scan input and coupled to receive a select signal, the multiplexer including a first input and a second input, the first input coupled to an output of the PRPG;

an inverter having an input coupled to the output of the PRPG and an output coupled to the second input of the multiplexer;

response compression logic coupled to the first scan output and configured to generate a test signature in response to an output pattern provided at the first scan output; and a test controller configured to:
set the select signal to a first value;
reset the PRPG with a reset seed, scan a first test pattern generated by the PRPG in response to the reset seed into the plurality of SRPG flip-flops via the first input of the MUX, after the first test pattern is scanned into the plurality of SRPG flip-flops, decouple the switched power supply from each SRPG flip-flop at a first time, after the switched power supply is decoupled from each SRPG flip-flop at the first time, couple the switched power supply back to each SRPG flip-flop at a second time, and after the switched power supply is coupled back to each SRPG flip-flop at the second time, provide a first output pattern at the first scan output to the response compression logic in response to the first test pattern.

19. The integrated circuit of claim 18, wherein the test controller is further configured to:

set the select signal to a second value, different from the first value;

reset the PRPG with the reset seed, scan an inverse of the first test pattern generated by the PRPG in response to the reset seed into the plurality of SRPG flip-flops via the inverter coupled to the second input of the MUX, after the inverse of the first test pattern is scanned into the plurality of SRPG flip-flops, decouple the switched power supply from each SRPG flip-flop at a third time, and after the switched power supply is decoupled from each SRPG flip-flop at the third time, couple the switched power supply back to each SRPG flip-flop at a fourth time, and after the switched power supply is coupled back to each SRPG flip-flop at the fourth time, provide a second output pattern at the first scan output to the response compression logic in response to the inverse of the first test pattern.

20. The integrated circuit of claim 18, wherein the test controller is further configured to:

the first test pattern is scanned into to the first plurality of SRPG flip-flops and prior to the switched power supply being decoupled from the SRPG flip-flops at the first time, assert an isolation signal at an isolation input of each SRPG flip-flop to enable each SRPG flip-flop to retain state; and the switched power supply is coupled back to the SRPG flip-flops at the second time, deassert the isolation signal at the isolation input of each SRPG flip-flop.

* * * * *